(12) United States Patent
Usui et al.

(10) Patent No.: US 7,700,383 B2
(45) Date of Patent: Apr. 20, 2010

(54) MANUFACTURING METHOD FOR SEMICONDUCTOR DEVICE AND DETERMINATION METHOD FOR POSITION OF SEMICONDUCTOR ELEMENT

(75) Inventors: Ryosuke Usui, Ichinomiya (JP); Yasunori Inoue, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 1147 days.

(21) Appl. No.: 11/082,505

(22) Filed: Mar. 17, 2005

(65) Prior Publication Data
US 2005/0206899 A1 Sep. 22, 2005

(30) Foreign Application Priority Data
Mar. 19, 2004 (JP) .............................. 2004-081722

(51) Int. Cl.
*H01L 21/66* (2006.01)
(52) U.S. Cl. .................. 438/16; 438/690; 438/689; 438/401; 438/462; 438/975; 257/797; 257/E21.531
(58) Field of Classification Search ................ 257/797, 257/E21.53; 438/401, 462, 975, 16, 689, 438/690
See application file for complete search history.

(56) References Cited

U.S. PATENT DOCUMENTS 6,614,120 B2 * 9/2003 Sato et al. .................. 257/758
2004/0142553 A1 * 7/2004 Kim .......................... 438/622
2005/0186753 A1 * 8/2005 Chen et al. .................. 438/401

FOREIGN PATENT DOCUMENTS

JP 2002-094247 3/2002

* cited by examiner

*Primary Examiner*—Lynne A Gurley
*Assistant Examiner*—Junghwa M Im
(74) *Attorney, Agent, or Firm*—Fish & Richardson P.C.

(57) ABSTRACT

A manufacturing method for a semiconductor device comprises: mounting a semiconductor element, having an alignment mark, on a substrate; forming a composite of metal film and insulating film such that the surface of the semiconductor element is covered therewith; and removing a part of the composite of metal film and insulating film so as to expose the alignment mark. The position of each electrode of the semiconductor element mounted on the substrate is determined based upon detection results obtained by detection of the exposed alignment mark.

18 Claims, 6 Drawing Sheets

MANUFACTURING METHOD FOR SEMICONDUCTOR DEVICE AND DETERMINATION METHOD FOR POSITION OF SEMICONDUCTOR ELEMENT

BACKGROUND OF THE INVENTION

1. Field of the Invention

The present invention relates to a manufacturing method for a semiconductor device while detecting the position of each semiconductor element using an alignment mark.

2. Description of the Related Art

With portable electronic appliances such as mobile phones, PDAs, DVCs and DSCs becoming more and more advanced in their capabilities, miniaturization and weight reduction of products have become essential for market acceptance. Accordingly, highly-integrated system LSIs for achieving these goals are demanded. Also, better ease and convenience of use are required of these electronic appliances. In this respect, high capabilities and high performance are required of LSIs used in these appliances. While the number of I/Os is increasing as a result of increasingly high integration of LSI chips, there is also a persistent requirement for miniaturization of packages themselves. In order to meet these incompatible demands, development of a semiconductor package adapted for high-density substrate mounting of semiconductor components is in serious demand.

In order to meet such demands, development of a packaging technique, which is referred to as "CSP (Chip Size Package)", is being undertaken.

With the multi-system-in-a-package technique using the wafer processing, the CSP technique as described above, and a manufacturing apparatus thereof, components such as an insulating film, a copper wiring electrode film, and so forth, are formed on multiple LSIs with vacuum bonding or the like. This enables a bumpless structure thereof, thereby realizing high-speed signal transmission, and also thereby allowing manufacturing of a package with a reduced height.

However, with conventional multi-system-in-a-package techniques such as the manufacturing technique disclosed in Japanese Unexamined Patent Application Publication No. 2002-94247, alignment of multiple chips is performed using a chip mounter, leading to difficulty in improving the alignment precision for mounting the chips. This leads to difficulty in improving the wiring precision dependent upon the chip-alignment precision, resulting in an excessive wiring margin. Accordingly, manufacturing of a high-density integrated semiconductor device, e.g., a multi-system in a package formed of semiconductor integrated circuits such as LSIs and so forth, requires further improved precision of wiring and so forth, which is a remaining technical problem.

SUMMARY OF THE INVENTION

The present invention has been made in view of the above problems, and accordingly, it is an object thereof to provide a technique for determining positional information regarding each semiconductor element mounted on a highly integrated semiconductor device, with high precision.

A manufacturing method for a semiconductor device according to a first aspect of the present invention comprises: mounting a semiconductor element, having an alignment mark, on a substrate; forming a composite of metal film and insulating film such that the surface of the semiconductor element is covered therewith; and removing a part of the composite of metal film and insulating film so as to expose the alignment mark.

With a position determination method for determining the position of a semiconductor element mounted on a substrate according to a second aspect of the present invention, the positional information regarding the semiconductor element mounted on the substrate is calculated based upon detection results obtained by detection of an exposed alignment mark formed on the semiconductor element. With the aforementioned method, following formation of a composite of metal film and insulating film such that the surface of the semiconductor element is covered therewith, a part of the composite of metal film and insulating film is removed so as to expose the alignment mark.

The alignment mark may be formed on the upper face of the semiconductor element. Furthermore, the semiconductor element may have multiple alignment marks. Furthermore, an arrangement may be made wherein the position of each electrode of the semiconductor element mounted on the substrate is determined based upon detection results obtained by detection of the exposed alignment mark.

The aforementioned methods allow high-precision measurement of the chip position with the exposed alignment mark formed on the semiconductor element as a scale. Thus, this allows the user to make circuit design with a reduced wiring margin, thereby enabling circuit design with fine wiring. Thus, this enables high-precision determination of the position of each semiconductor element mounted on a highly integrated multi-system in package, thereby providing a semiconductor device with improved-precision wiring and so forth.

DETAILED DESCRIPTION OF THE INVENTION

Figure 1A:
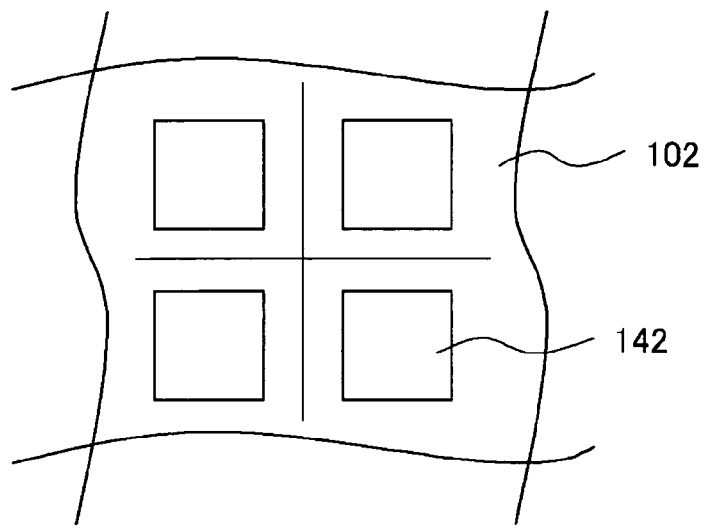
FIGS. 1A through 2B are diagrams for describing a semiconductor device according to an embodiment of the present invention.
Figure 1B:
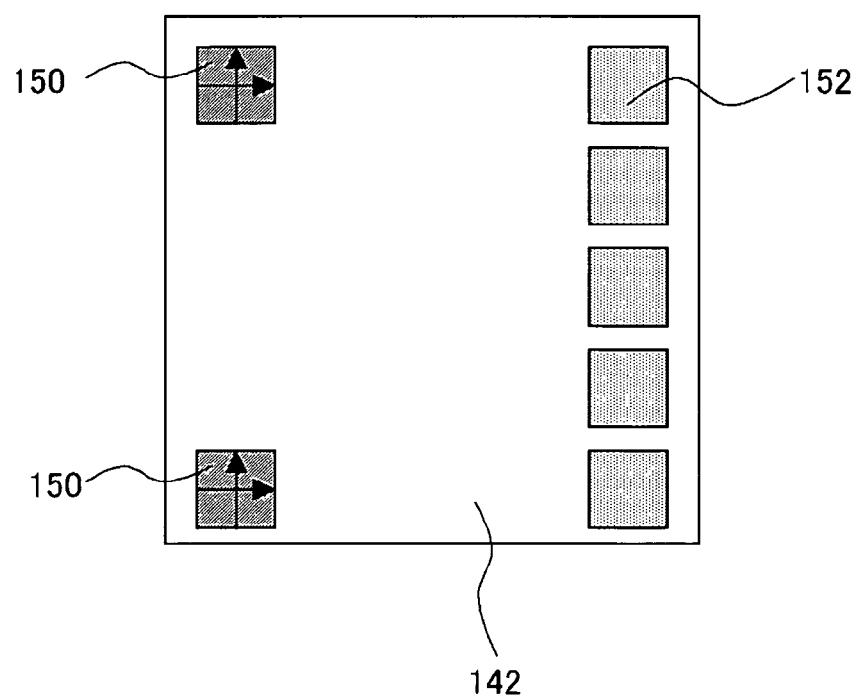

FIGS. 1A through 5C are diagrams for describing manufacturing steps for a semiconductor device according to the present embodiment. As shown in FIG. 1A, LSIs 142 are formed on a wafer 102. Here, each LSI 142 includes alignment marks 150 at two positions other than the region where the electrodes (not shown) are formed as shown in FIG. 1B. The reason is as follows. An arrangement wherein the alignment mark 150 is formed in a region where the electrode is formed leads to an unintended electrical connection of the electrode to a conductive material formed by plating in a subsequent step following exposure of the alignment mark 150.

Each alignment mark 150 is formed by layering materials as follows. Examples of the combination of the material for the alignment mark 150 include: a combination of silicon and a silicon oxide film; a combination of polysilicon and a silicon oxide film; a combination of a tungsten oxide film and TEOS, a combination of copper and an SOG film; a combination of aluminum and an SOG film; and so forth.

On the other hand, each alignment mark 150 should be formed at a position which allows the user to confirm the shape of the alignment mark by observing the surface of the LSI 142, and is preferably formed on the uppermost layer of the LSI 142. Such a structure wherein the alignment mark 150 is formed on the uppermost layer of the LSI 142 allows a system package manufacturing apparatus to monitor the position of the alignment mark 150 with ease following exposure thereof by a subsequent step for laser trepanning as described later.

Figure 2A:
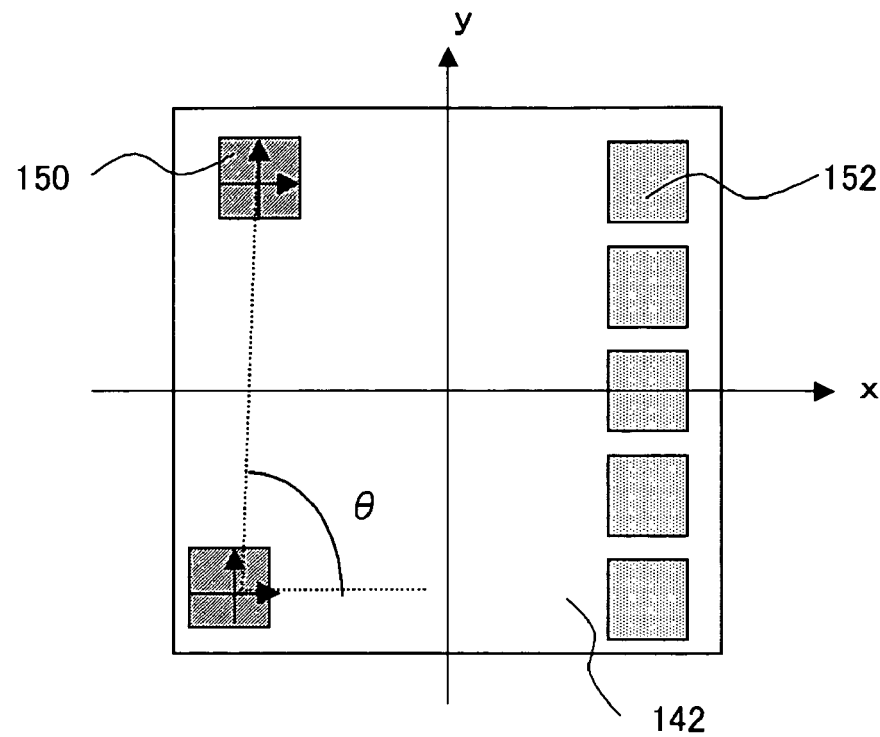

At the time of forming the two alignment marks 150, the center position of each alignment mark 150, and the center position of each electrode of the LSI 142 such as bonding pads 152 formed on the LSI 142 at a pitch of 50 μm, for example, are measured on the two-dimensional coordinates consisting of the X-axis and the Y-axis with a desired point on the LSI 142 as the origin. Furthermore, the slant of the angle θ between these alignment marks 150 is measured as shown in FIG. 2A. Then, the positional information regarding the aforementioned alignment marks 150 and bonding pads 152 is stored in the system package manufacturing apparatus as described later. Subsequently, dicing of the wafer 102 is performed, whereby the wafer 102 is divided into LSIs 142 (not shown).

Figure 3A:
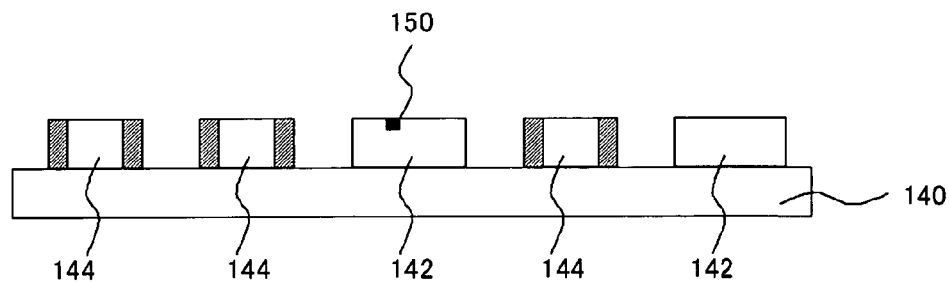
FIGS. 3A through 5C are cross-sectional diagrams for describing manufacturing processes for the semiconductor device according to the embodiment of the present invention.

As shown in FIG. 3A, the multiple circuit devices such as the LSIs 142, passive elements 144, and the like, are mounted on a stretched substrate 140. Here, a stretchable tape may be employed as the substrate 140, which has an adhesive property for fixing the LSIs 142 and the passive elements 144 on the surface thereof. Note that examples of the passive elements 144 include chip capacitors, chip resistors, and so forth. Following mounting of the circuit devices on the substrate 140, the substrate 140, on which the multiple circuit devices such as LSIs 142, the passive elements 144, and the like, have been mounted, is returned to the normal unstretched state.

Figure 3B:
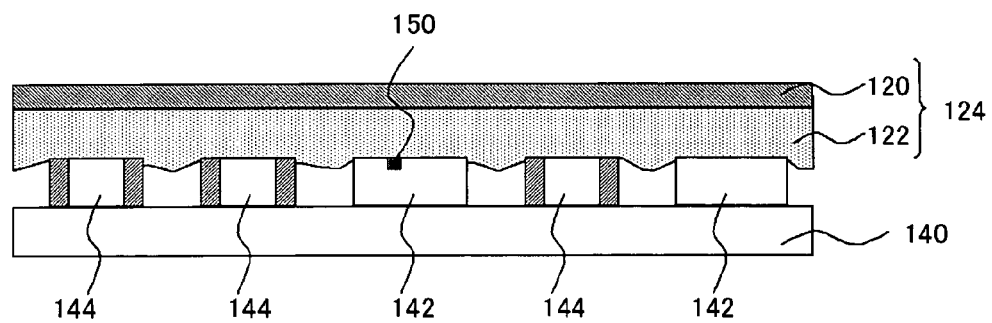

Next, as shown in FIG. 3B, the substrate 140, on which the multiple LSIs 142 and passive elements 144 have been fixed, is covered with a composite of metal film and insulating resin film 124 formed of a metal film 120 and an insulator resin film 122. Furthermore, the substrate 140 and the composite of metal film and insulating resin film 124 are pressed into contact with each other such that the LSIs 142 and the passive elements 144 are embedded within the insulating resin film 122.

Figure 3C:
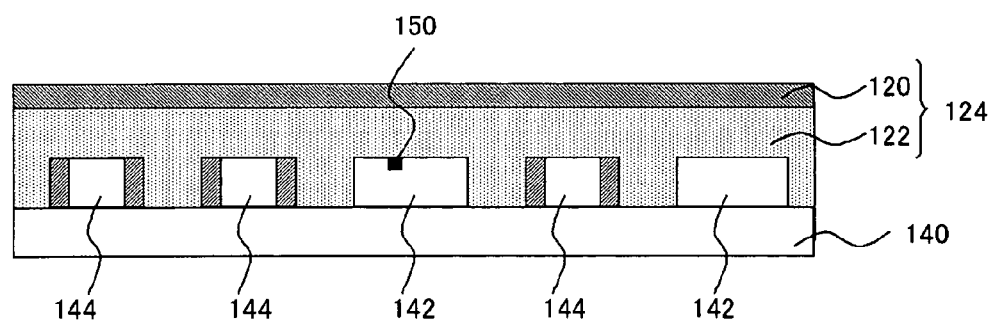

Subsequently, heat is applied to the insulating resin film 122 in a vacuum or under reduced pressure, depending upon the kind of the resin forming the insulating resin film 122, whereby the composite of metal film and insulating resin film 124 is bonded to the substrate 140 under pressure. As a result, the LSIs 142 and the passive elements 144 are embedded within the insulating resin film 122 as shown in FIG. 3C, whereby the LSIs 142 and the passive elements 144 are bonded to the insulating resin film 122.

In this stage, the LSIs 142 are shielded by the composite of metal film and insulating resin film 124, leading to a situation wherein the user cannot observe the alignment marks 150 formed on the LSIs 142 due to the composite of metal film and insulating resin film 124 shielding the entire face of the substrate 140.

Here, rolled metal such as a rolled copper foil and so forth may be employed as the metal film 120, for example. On the other hand, any kind of material may be employed as the insulating resin film 122, as long as it has a property that the material is sufficiently softened under a predetermined increased temperature. Examples of such kinds of materials employed as the insulating resin film 122 include: epoxy resin; melamine derivative such as BT resin and so forth; liquid-crystal polymer; PPE resin; polyimide resin; fluororesin; phenol resin; polyamide-bismaleimide resin; and so forth. Furthermore, the insulating resin film 122 formed of such a materiel may contain a filler with a suitable concentration corresponding to the kind of the aforementioned material.

On the other hand, a film, wherein the metal film 120 is bonded onto the insulating resin film 122, may be employed as the composite of metal film and insulating resin film 124. Also, the composite of metal film and insulating resin film 124 may be formed by a process wherein a resin composition for forming the insulating resin film 122 is coated and dried on the metal film 120. The resin composition according to the present embodiment may contain a hardening agent, a hardening accelerating agent, and so forth, without departing from the technical scope of the present invention.

Also, the composite of metal film and insulating resin film 124 may be formed by a process wherein the substrate 140 is covered with the B-stage insulating resin film 122, following which the metal film 120 is thermally bonded to the insulating resin film 122 at the same time of thermally bonding the insulating resin film 122 to the LSIs 142 and the passive elements 144.

Figure 4A:
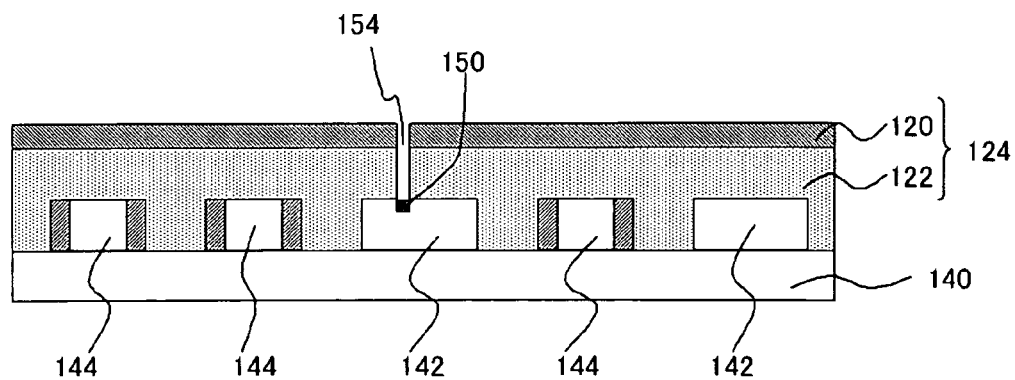

Next, as shown in FIG. 4A, trepanning holes 154 are formed on a part of the face of the composite of metal film and insulating resin film 124 with laser trepanning using a carbon dioxide gas laser so as to expose the two alignment marks 150 formed on the surface of each LSI 142.

Note that the carbon dioxide gas laser beam is cast onto the composite of metal film and insulating resin film 124 in two steps with different pulse widths, i.e., a first step under first conditions and a second step under second conditions. Note that the laser is emitted under the conditions as follows, for example.

Pulse cycle: 0.25 ms
Output: 1.0 W

First Conditions
Pulse width: 8 to 10 μs
The number of shots: 1

Second Conditions
Pulse width: 3 to 5 μs
The number of shots: 3

The aforementioned laser trepanning allows formation of the trepanning holes 154 each of which have a tapered side wall wherein the closer to the insulating film 122 from the metal film 120, the smaller the diameter of the trepanning hole 154 is.

Figure 2B:
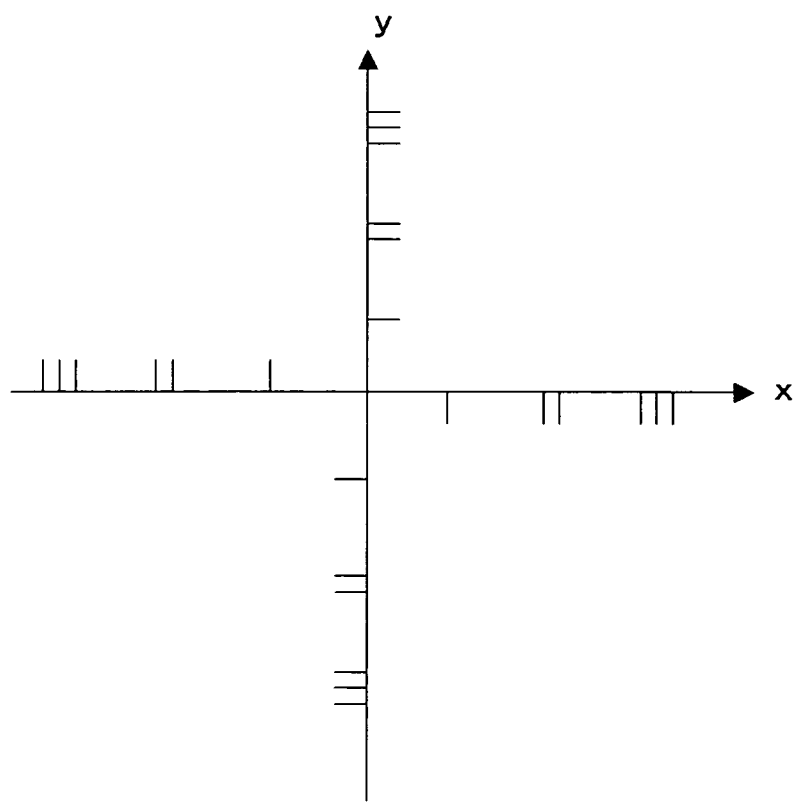

Here, each alignment mark 150 is formed with a shape as shown in FIG. 2B, for example. That is to say, the alignment mark 150 consists of two lines serving as the X-axis and the Y-axis with the center of the alignment mark 150 as the origin, each of which have scale marks formed every 10 μm. At the time of laser trepanning, the user forms a hole around each alignment mark 150 so as to expose the scale marks of the alignment mark 150. Subsequently, the scale marks are observed with an optical microscope included in the system package manufacturing apparatus, thereby obtaining positional information regarding the center of each alignment mark 150.

Now, description will be made regarding the size of each hole formed on a part of the face of the composite of metal film and insulating resin film 124. Formation of the trepanning hole with an excessively small diameter leads to a difficulty in exposure of the alignment mark 150. On the other hand, formation of the trepanning hole with an excessively large diameter often leads to thermal damage of the LSI 142. Giving consideration to the aforementioned fact, each trepanning hole is preferably formed with a diameter of 30 μm to 50 μm, and is more preferably formed with a diameter of 40 μm.

As described above, the system package manufacturing apparatus stores the positional information regarding the positional relation between the center positions of the two alignment mark 150 and the center position of each bonding pad 152 formed on the LSI 142, before bonding of the composite of metal film and insulating resin film 124 onto the substrate 140.

This allows the system package manufacturing apparatus to obtain the positional information regarding each bonding pad 152 formed on the LSI 142 based upon the positional information regarding the center position of each alignment marks 150 obtained by observing the scale marks of the alignment marks 150 using the optical microscope. This permits the user to design a circuit layout with a reduced margin required for wiring between each LSI 142 and other circuit devices described later, thereby enabling high integration of the multi-system in a package including the LSIs 142 due to reduced-size wiring.

Figure 4B:
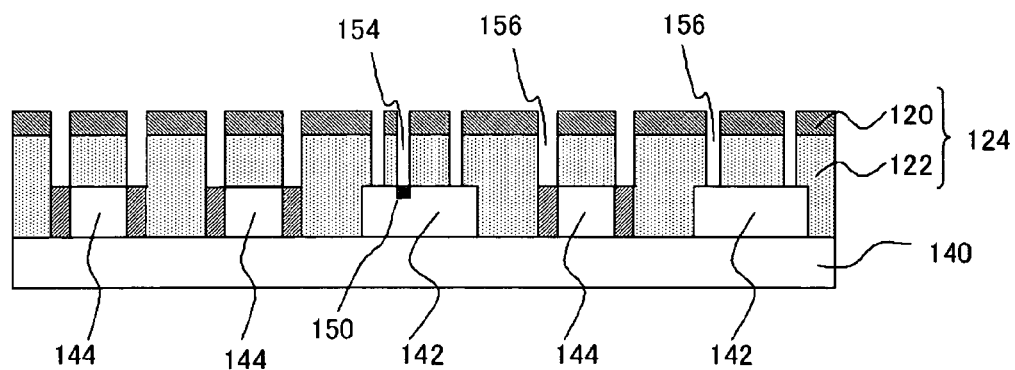

Next, through holes 156 are formed with laser trepanning using the carbon dioxide gas laser so as to expose the bonding pads 152, as shown in FIG. 4B. Here, each through hole 156 is preferably formed with a diameter of 30 μm to 50 μm. Furthermore, each through hole 156 is preferably formed with a diameter smaller than the length of one side of the pad electrode.

Note that the carbon dioxide gas laser beam is cast onto the composite of metal film and insulating resin film 124 in two steps with different pulse widths, i.e., a first step under first conditions and a second step under second conditions. Note that the laser is emitted under the conditions as follows, for example.

Pulse cycle: 0.25 ms
Output: 1.0 W

First Conditions
Pulse width: 8 to 10 μs
The number of shots: 1

Second Conditions
Pulse width: 3 to 5 μs
The number of shots: 3

The aforementioned laser trepanning allows formation of the through holes 156 each of which have a tapered side wall wherein the closer to the insulating film 122 from the metal film 120, the smaller the diameter of the through hole 156 is.

Figure 5A:
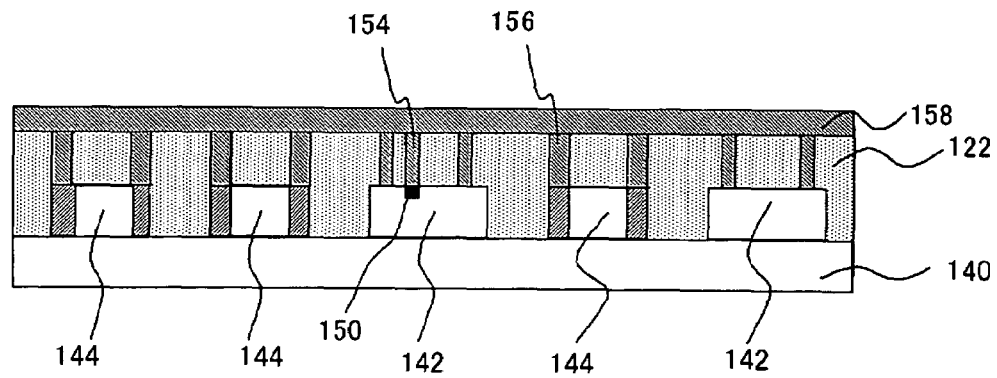
Figure 5B:
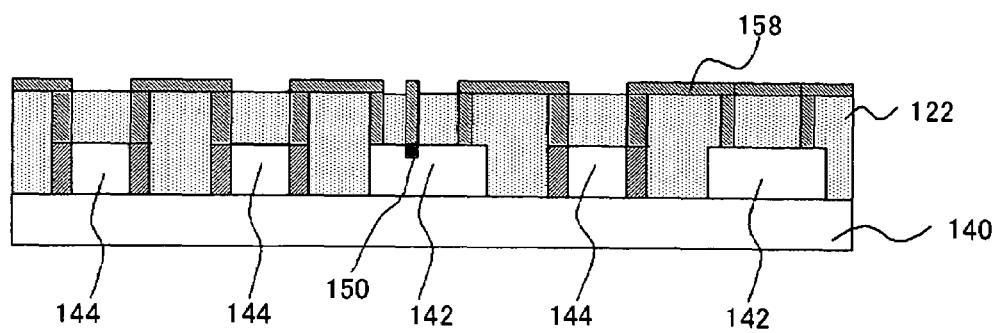
Figure 5C:
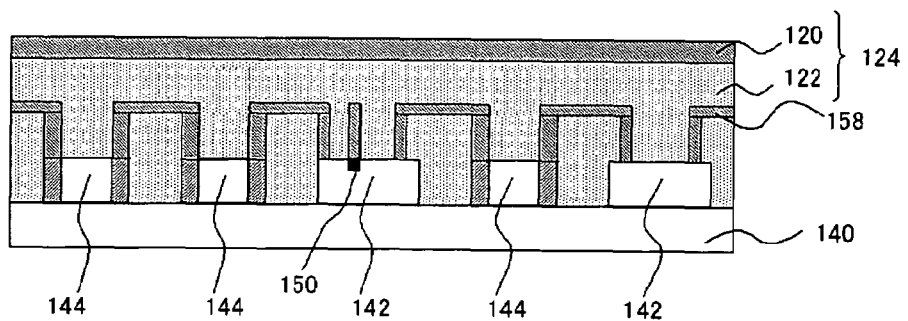

Next, plating is performed on the surface of the composite of metal film and insulating resin film 124, using the same metal as that forming the metal film 120, whereby each through hole 156 thus formed is filled with an electroconductive material 158, as shown in FIG. 5A. Here, plating is performed to a thickness of around 15 gin, for example. Subsequently, patterning of the metal film 120 and the electroconductive material 158 is performed so as to form wiring between circuit devices, using direct-write laser lithography, thereby electrically connecting between the multiple circuit devices such as the LSIs 142, the passive elements 144, and the like, as shown in FIG. 5B. Furthermore, another composite of metal film and insulating resin film 124 is formed on the wiring portion thus formed, as shown in FIG. 5C.

The semiconductor module thus formed has a layer structure wherein the composite of metal film and insulating resin film 124 is formed on the substrate 140 so as to form the wiring layer, following which the other composite of metal film and insulating resin film 124 is layered thereon, thereby allowing electric connection between the multiple LSIs 142, passive elements 144, and other devices.

While description has been made regarding a preferred embodiment of the present invention, it is needless to say that the present invention is not restricted to the aforementioned embodiment, rather, a range of modifications may be made by those skilled in this art within the scope of the present invention.

For example, while description has been made regarding an arrangement wherein the LSIs 142 is employed as semiconductor elements, an arrangement may be made wherein other semiconductor elements such as ICs or the like are employed in an arrangement according to the present invention. Also, while description has been made regarding an arrangement wherein the metal film 120 is formed of copper, the metal forming the metal film 120 according to the present invention is not restricted to copper; rather, an arrangement may be made wherein the metal film 120 is formed of metal with high electric conductivity such as aluminum, gold, or the like.

Also, while description has been made regarding an arrangement wherein the composite of metal film and insulating resin film 124 is bonded to the substrate 140 under pressure, an arrangement may be made wherein, following formation of the insulating resin film 122 on the substrate 140, the metal film 120 is formed on the surface of the insulating resin film 122. Also, while description has been made regarding an arrangement wherein each alignment mark 150 is formed in the shape as shown in FIG. 2B, an arrangement may be made wherein the alignment mark 150 is formed in other shapes such as concentric circles or the like, as long as it allows the system package manufacturing apparatus to obtain the positional information regarding each bonding pad 152 based upon the exposed alignment marks 150.

Also, while description has been made regarding an arrangement wherein the scale marks of each alignment mark 150 are formed at a pitch of 10 μm, an arrangement may be made wherein the scale marks of each alignment mark 150 are formed at other pitches, e.g., 5 μm, as long as it allows the system package manufacturing apparatus to detect the position of each bonding pad 152 based upon the positional information regarding the alignment marks with such scale marks.

Also, while description has been made regarding an arrangement wherein, following formation of the LSI 142, each alignment mark 150 is formed thereon, the order of the step for forming these alignment marks 150 is not restricted in particular, as long as the completed LSI 142 has the alignment marks 150 which can be observed from the outside. For example, an arrangement may be made wherein each LSI 142 is formed of layers each of which have the alignment marks 150, from the beginning of the manufacturing process for the LSIs 142. Also, while description has been made regarding an arrangement wherein plating is performed using the same metal as that forming the metal film 120, an arrangement may be made wherein plating is performed using any kind of metal as long as it has excellent electric conductivity.

Also, while description has been made regarding an arrangement wherein each LSI 142 includes the two alignment marks 150, an arrangement may be made wherein three or more alignment marks 150 are formed. This allows measurement of each bonding pad with higher precision, thereby allowing the user to make circuit designs with finer wiring. Thus, this allows high integration of the multi-system in a package, i.e., allows highly integrated multi-system in a package.

Figure 6A:
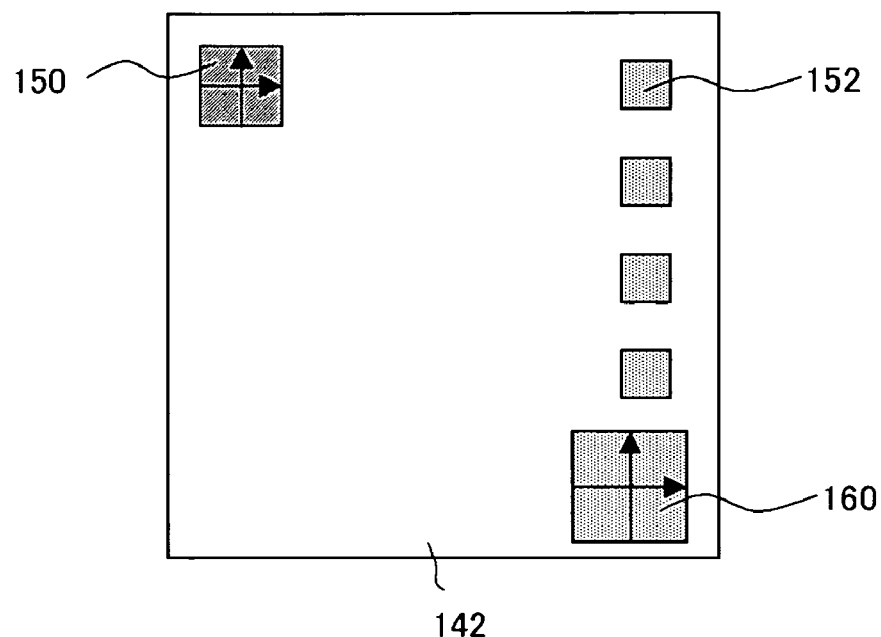
FIG. 6 is a diagram for describing the semiconductor device according to the embodiment of the present invention.
Figure 6B:
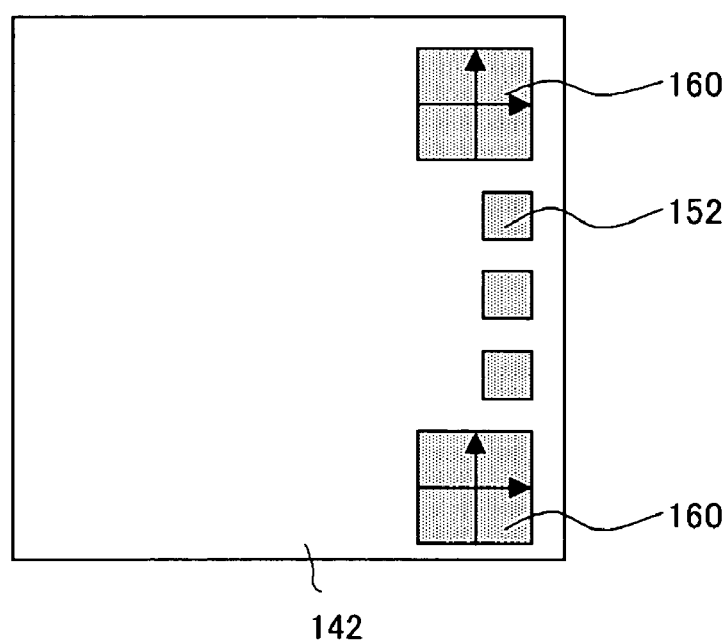

Also, an arrangement may be made wherein each LSI 142 includes a bonding pad 160 formed with a large size having scale marks on the surface thereof as with the alignment mark 150, and includes only the single alignment mark 150, as shown in FIG. 6A, as long as it allows measurement of the positions of the LSI 142 and each bonding pad 152. Furthermore, an arrangement may be made wherein each LSI 142 includes the multiple bonding pads 160 also serving as alignment marks, with no alignment marks 150 provided, as shown in FIG. 6B. This enables manufacturing of a highly integrated multi-system in a package with finer wiring while omitting the process for forming the alignment marks 150 and the process for laser trepanning of the portions near the alignment marks 150.

Also, while description has been made in the aforementioned embodiment regarding an arrangement wherein the system package manufacturing apparatus calculates positional information regarding each bonding pad 152, which is an electrode of the LSI 142, based upon the positional relation between the bonding pads 152 and the alignment marks 150 stored beforehand, and the positional information regarding the alignment marks 150 obtained following exposure thereof by laser trepanning, an arrangement may be made wherein the system package manufacturing apparatus calculates positional information regarding an electrode of the LSI 142 other than the bonding bad 152 based upon the positional relation between the aforementioned electrode of the LSI 142 other than the bonding pad 152 and the alignment marks 150 stored beforehand, and the positional information regarding the alignment marks 150 obtained following exposure thereof by laser trepanning. Also, while description has been made regarding an arrangement wherein the substrate 140 is formed of a stretchable material, an arrangement may be made wherein the substrate 140 is formed of a non-stretchable material.

What is claimed is:

1. A manufacturing method for a semiconductor device comprising:
   mounting a semiconductor element, having an alignment mark, on a substrate;
   forming a stack of a metal film and an insulting film facing the semiconductor element such that the surface of said semiconductor element is covered therewith;
   removing a part of said metal film and insulating film so as to expose said alignment mark;
   forming a through-hole so as to expose a bonding pad of the semiconductor device by removing the metal film and the insulating film and identifying the position of the bonding pad using the exposed alignment mark;
   filling the through-hole with an electroconductive material, and increasing the thickness of the metal film so as to form a metal layer electrically connected with the semiconductor device; and
   selectively removing the metal layer so as to form a wiring layer electrically connected to the semiconductor element.

2. A manufacturing method for a semiconductor device according to claim 1, wherein said semiconductor element has said alignment mark on the upper face thereof.

3. A manufacturing method for a semiconductor device according to claim 1, wherein said semiconductor element has a plurality of said alignment mark.

4. A manufacturing method for a semiconductor device according to claim 2, wherein said semiconductor element has a plurality of said alignment mark.

5. A manufacturing method for a semiconductor device according to claim 1, further comprising detecting said exposed alignment mark so as to obtain positional information regarding electrodes of said semiconductor element mounted on said substrate.

6. A manufacturing method for a semiconductor device according to claim 2, further comprising detecting said exposed alignment mark so as to obtain positional information regarding electrodes of said semiconductor element mounted on said substrate.

7. A manufacturing method for a semiconductor device according to claim 3, further comprising detecting said exposed alignment mark so as to obtain positional information regarding electrodes of said semiconductor element mounted on said substrate.

8. A manufacturing method for a semiconductor device according to claim 4, further comprising detecting said exposed alignment mark so as to obtain positional information regarding electrodes of said semiconductor element mounted on said substrate.

9. The manufacturing method for a semiconductor device according to claim 1, wherein removing the part of the metal film and insulating film so as to expose said alignment mark comprises removing a portion of the metal film and insulating film such that that semiconductor element is exposed, wherein the portion extends from the upper surface of the metal film to the semiconductor element.

10. A position determination method for determining the position of a semiconductor element mounted on a substrate, wherein the positional information regarding said semiconductor element mounted on said substrate is calculated based upon detection results obtained by detection of an exposed alignment mark formed on said semiconductor element, and
    wherein, following formation of a stack of a metal film and an insulating film facing the semiconductor element such that the surface of said semiconductor element is covered therewith, a part of said metal film and insulating film is removed so as to expose said alignment mark;
    a through-hole is formed so as to expose a bonding pad of the semiconductor device by removing the metal film and the insulating film, wherein the position of the bonding pad is identified using the exposed alignment mark;
    the through-hole is filled with an electroconductive material and the thickness of the metal film is increased to form a metal layer electrically connected with the semiconductor device; and
    the metal layer is selectively removed, thereby forming a wiring layer electrically connected to the semiconductor element.

11. A position determination method according to claim 10, wherein said semiconductor element has said alignment mark on the upper face thereof.

12. A position determination method according to claim 10, wherein said semiconductor element has a plurality of said alignment mark.

13. A position determination method according to claim 11, wherein said semiconductor element has a plurality of said alignment mark.

14. A position determination method according to claim 10, wherein the position of each electrode formed on said semiconductor element mounted on said substrate is determined based upon detection results obtained by detection of said exposed alignment mark.

15. A position determination method according to claim 11, wherein the position of each electrode formed on said semiconductor element mounted on said substrate is determined based upon detection results obtained by detection of said exposed alignment mark.

16. A position determination method according to claim 12, wherein the position of each electrode formed on said semiconductor element mounted on said substrate is determined based upon detection results obtained by detection of said plurality of exposed alignment marks.

17. A position determination method according to claim 13, wherein the position of each electrode formed on said semiconductor element mounted on said substrate is determined based upon detection results obtained by detection of said plurality of exposed alignment marks.

18. A position determination method according to claim 10 wherein the metal film and insulating film that are removed to expose the alignment mark are removed such that a portion of the metal film and the insulating film extending from the upper surface of the metal film to the semiconductor element is removed and the semiconductor element is exposed.

* * * * *